United States Patent
Saez-Zamora et al.

(10) Patent No.: US 8,995,134 B2
(45) Date of Patent: Mar. 31, 2015

(54) ELECTRICALLY-COOLED POWER MODULE

(75) Inventors: Jose Alberto Saez-Zamora, Terrassa (ES); Xavier Jorda-Sanuy, Cerdanyola del Valles (ES); Jordi Suarez-Jimenez, Terrassa (ES); Jose Gabriel Fernandez-Banares, Valls (ES); Xavier Perpina-Giribet, Cerdanyola del Valles (ES); Miquel Vellvehi-Hernandez, Cerdanyola del Valles (ES); Laurent Aubouy, Terrassa (ES)

(73) Assignee: Lear Corporation, Southfield, MI (US)

( * ) Notice: Subject to any disclaimer, the term of this patent is extended or adjusted under 35 U.S.C. 154(b) by 400 days.

(21) Appl. No.: 13/476,249

(22) Filed: May 21, 2012

(65) Prior Publication Data

US 2012/0299375 A1    Nov. 29, 2012

Related U.S. Application Data

(60) Provisional application No. 61/490,754, filed on May 27, 2011.

(51) Int. Cl.
*H05K 7/20* (2006.01)
*H01L 23/24* (2006.01)
(Continued)

(52) U.S. Cl.
CPC ............... *H05K 7/209* (2013.01); *H01L 23/24* (2013.01); *H01L 23/3735* (2013.01); *H01L 23/38* (2013.01); *H01L 23/4334* (2013.01);
(Continued)

(58) Field of Classification Search
CPC ...................... H01L 23/38; H05K 2201/10219
See application file for complete search history.

(56) References Cited

U.S. PATENT DOCUMENTS 5,895,964 A * 4/1999 Nakayama ..................... 257/577
6,083,770 A   7/2000 Sato et al.
(Continued)

FOREIGN PATENT DOCUMENTS

DE    19527867 A1    1/1997
JP    1245549 A    9/1989
(Continued)

OTHER PUBLICATIONS

German Office Action for corresponding German Application No. 10 2012 208 745.1, mailed Jan. 16, 2013, 8 pages.
(Continued)

*Primary Examiner* — Gregory Thompson
(74) *Attorney, Agent, or Firm* — Brooks Kushman P.C.

(57) ABSTRACT

In one embodiment, an apparatus for cooling an electrical component in a vehicle is provided. The apparatus comprises a power module including the electrical component for converting energy. The power module includes a first printed circuit board (PCB) including a first ceramic substrate for receiving the electrical component. The power module further includes a plurality of thermoelectric cells being coupled to the first PCB for discharging heat away from the electrical component. The power module further includes a second PCB including a second ceramic substrate being coupled to the plurality of thermoelectric cells, the first ceramic substrate and the second ceramic substrate for electrically isolating the electrical component from the first PCB and the second PCB and for providing thermal conductance from the electrical component through the plurality of thermoelectric cells.

16 Claims, 2 Drawing Sheets

(51) Int. Cl.
*H01L 23/373* (2006.01)
*H01L 23/38* (2006.01)
*H01L 23/433* (2006.01)
*H01L 25/07* (2006.01)
*H01L 23/31* (2006.01)
*H01L 35/32* (2006.01)
*H01L 23/00* (2006.01)
*H02M 7/00* (2006.01)

(52) U.S. Cl.
CPC .......... *H01L25/072* (2013.01); *H01L 23/3121* (2013.01); *H01L 35/32* (2013.01); *H01L 24/32* (2013.01); *H01L 24/48* (2013.01); *H01L 24/73* (2013.01); *H01L 24/92* (2013.01); *H01L 2224/32225* (2013.01); *H01L 2224/48227* (2013.01); *H01L 2224/73265* (2013.01); *H01L 2224/92247* (2013.01); *H01L 2924/1203* (2013.01); *H01L 2924/1301* (2013.01); *H01L 2924/1305* (2013.01); *H01L 2924/13055* (2013.01); *H01L 2924/13062* (2013.01); *H01L 2924/13091* (2013.01); *H01L 2924/16195* (2013.01); *H01L 2924/19107* (2013.01); *H02M 7/003* (2013.01); *H01L 2224/48137* (2013.01); *H01L 2224/48472* (2013.01); *H01L 2924/1306* (2013.01)
USPC ........................................ 361/721; 361/707

(56) References Cited

U.S. PATENT DOCUMENTS

| 6,455,930 | B1* | 9/2002 | Palanisamy et al. | 257/706 |
| 2003/0214031 | A1* | 11/2003 | Onoue | 257/734 |
| 2004/0190263 | A1* | 9/2004 | Jadhav et al. | 361/708 |
| 2005/0077619 | A1* | 4/2005 | Ramanathan et al. | 257/719 |
| 2006/0001140 | A1 | 1/2006 | Lee et al. | |
| 2008/0186670 | A1* | 8/2008 | Lyon et al. | 361/687 |
| 2009/0056345 | A1 | 3/2009 | Edwards et al. | |
| 2009/0321909 | A1 | 12/2009 | Gu et al. | |
| 2010/0079959 | A1 | 4/2010 | Letz | |

FOREIGN PATENT DOCUMENTS

| JP | 11154720 A | 6/1999 |
| JP | 2000340723 A | 12/2000 |
| JP | 2003017638 A | 1/2003 |
| JP | 2004343924 A | 12/2004 |

OTHER PUBLICATIONS

English translation for DE 19527867, 4 pages, Jan. 30, 1997.
English translation for JP 11154720, 4 pages, Jun. 8, 1999.
Chinese Office Action for corresponding Application No. 201210167633.2, 6 pages, Jun. 4, 2014.

* cited by examiner

ELECTRICALLY-COOLED POWER MODULE

CROSS-REFERENCE TO RELATED APPLICATIONS

This application claims the benefit of U.S. provisional Application No. 61/490,754 filed on May 27, 2011, the disclosure of which is hereby incorporated by reference in its entirety.

TECHNICAL FIELD

Embodiments set forth herein generally relate to an electrically-cooled power module in a vehicle.

BACKGROUND

It is known to provide a mechanism for cooling electronics that generate various amounts of heat. One example of controlling the temperature of an electronic device is set forth below.

United States Patent Publication No. 2005/0077619 to Ramanathan et al. provides a microelectronic assembly having thermoelectric elements formed on a die so as to pump heat away from the die when current flows through the thermoelectric elements. In one embodiment, the thermoelectric elements are integrated between conductive interconnection elements on an active side of the die. In another embodiment, the thermoelectric elements are on a backside of the die and electrically connected to a carrier substrate on a front side of the die. In a further embodiment, the thermoelectric elements are formed on a secondary substrate and transferred to the die.

SUMMARY

In one embodiment, an apparatus for cooling an electrical component in a vehicle is provided. The apparatus comprises a power module including the electrical component for converting energy. The power module includes a first printed circuit board (PCB) including a first ceramic substrate for receiving the electrical component. The power module further includes a plurality of thermoelectric cells being coupled to the first PCB for discharging heat away from the electrical component. The power module further includes a second PCB including a second ceramic substrate being coupled to the plurality of thermoelectric cells, the first ceramic substrate and the second ceramic substrate for electrically isolating the electrical component from the first PCB and the second PCB and for increasing thermal conductance from the electrical component through the plurality of thermoelectric cells.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

Figure 1:
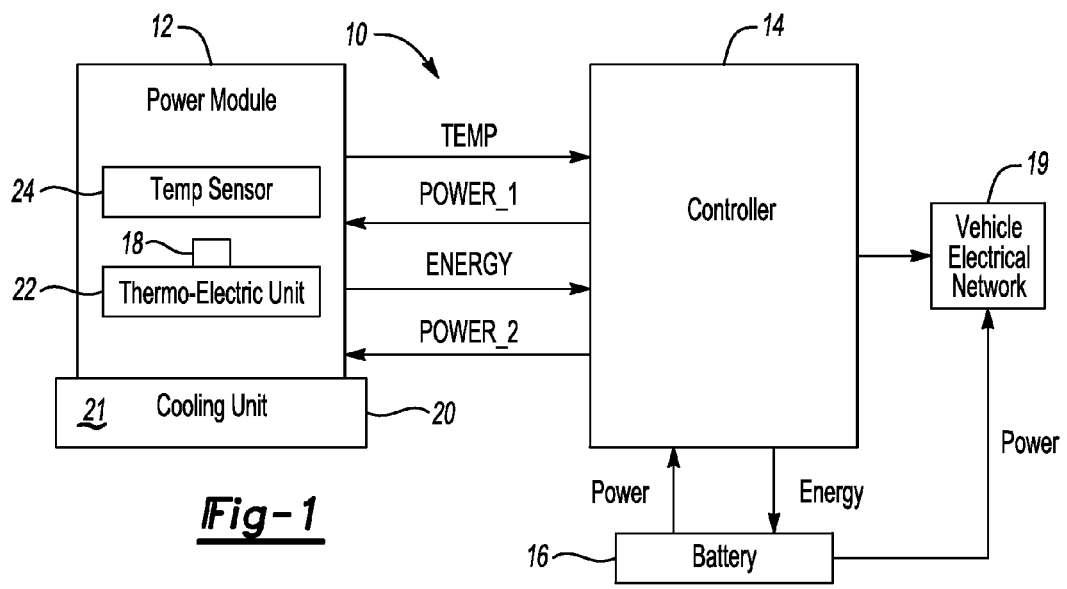
FIG. 1 depicts an apparatus for electrically cooling a power module in accordance to one embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The embodiments of the present disclosure generally provide for a plurality of circuits and/or electrical devices. All references to the circuits or electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and/or the other electrical devices. Such circuits and/or other electrical devices may be combined with each other and/or separated in any manner based on the particular type of electrical implementation that is desired. It is recognized that any circuit and/or other electrical device disclosed herein may include any number of microprocessors, integrated circuits, memory devices (e.g., FLASH, RAM, ROM, EPROM, EEPROM, or other suitable variants thereof) and software which co-act with one another to perform operation(s) disclosed herein.

Electric vehicles ("EV") and hybrid electric vehicles (HEV) use power switching devices or electronics to direct electric energy flow to a motor or to and from one or more batteries, or even to and from a domestic main supply. Even if the power switching device is implemented in a high efficiency manner, energy loss may be exhibited during electrical energy transfer. Such energy loss may be in the form of heat loss. Accordingly, it may be beneficial to eliminate heat from the power switching device as soon as the heat it is generated. Further, it may be beneficial to capture wasted energy in terms of heat, by way of electric energy.

Various embodiments set forth herein generally provide for a power module that includes at least one electrical component that generates heat while converting energy. A thermoelectric unit is coupled to the electrical component for discharging heat therefrom in the event a temperature exceeds a predetermined threshold. The thermo-electric unit is powered from a power supply to discharge heat away from the electrical component. In the event the temperature is below the predetermined threshold, the thermo-electric unit may convert the thermal difference between a top and bottom portion thereof to generate electrical energy and to provide the same to the power supply.

The thermo-electric unit includes a first printed circuit board (PCB), a second PCB, and a plurality of thermoelectric cells. The plurality of thermoelectric cells are positioned between the first and the second PCBs Each of the first and the second PCBs are formed of direct copper bonding (DCB) and each generally includes a ceramic substrate therein. The use of DCB, along with the use of ceramic substrate within the first and the second PCBs, has been found to provide adequate electrical isolation (i.e., from the electrical component) and to increase thermal conductance (i.e., from the electrical component through the thermo-electric cells).

FIG. 1 depicts a system 10 for electrically cooling a power module 12 in accordance to one embodiment. The system 10 further includes a controller 14 and a power source 16. In general, the power module 12 may be positioned in a vehicle and may be used to convert hi-energy from one form into another. For example, the power module 12 may be implemented as a converter such as a DC/DC converter that converts high DC voltage into a low DC energy (or vice versa), an inverter that converts high DC voltage into AC voltage, or other suitable device.

The power module 12 may include any number of electrical components 18 which aid in the conversion of hi-energy from one form into another. The electrical component 18 may be a power switching device, such as an insulated gate bipolar transistor (IGBT), a metal oxide semiconductor field effect transistor, a junction gate field-effect transistor (JFET), a bi-polar junction transistor, a diode, a thyristor, etc. In general, the electrical components 18 may have efficiency losses normally in the form of dissipated heat. Such heat should be extracted or passed away from the power module 12 to avoid an excessive increase in the temperature of the electric component 18. Otherwise, there may be a deterioration of the electrical component 18 that may lead to a performance degradation life reduction.

A cooling unit 20 is operably coupled to the electrical component 18 to discharge heat therefrom. The cooling unit 20 generally acts like a heat sink and includes an internal circuit (or cooling loop 21) for circulating air or a liquid (e.g., water, glycol, etc.) in one or more sections of the power module 12 to discharge the heat away from the electrical component 18. A pump (not shown) may force the liquid around the power module 12 in which heat is transferred to the circulating liquid thus decreasing the temperature of the electrical component 18. While the cooling unit 20 may be efficient in terms of heat exchange, its reaction to temperature changes in the electrical component 18 may be slow not only due to the overall inertia of the cooling unit 20, but also due to the overall length of the thermal path. Further, power is needed to operate the cooling unit 20. The cooling unit 20 may be powered by the controller 14 (which receives its power from the battery 16) or may be powered directly from the battery 16.

A thermo-electric unit 22 is positioned between the electrical component 18 and the cooling unit 20. The thermo-electric unit 22 is situated so as to be physically contacting the electrical component 18. By situating the thermo-electric unit 22 such that it is physically contacting the electrical component 18, the overall thermal path of the heat generated by the electrical component 18 may be shortened which may allow the electrical component 18 to cool at a faster rate. Contrast this aspect with an implementation that did not include the thermo-electric unit 22 and it can be seen that the thermal path between the electrical component 18 and the cooling unit 20 is larger which indicates that it may take longer to cool the electrical component. The thermo-electric unit 22 generally comprises a plurality of Peltier cells for discharging heat away from the electrical component 18 to the cooling system 20. The thermo-electric unit 22 is configured to generate a voltage when a temperature difference is present from a top side of the unit 22 and a bottom side of the unit 22. In addition, the thermo-electric unit 22 is configured to generate a temperature difference and cool the electrical component 18 when power is applied thereto.

A temperature sensor 24 is positioned proximate to the electrical component 18 for providing a temperature of the electrical component 18. The temperature sensor 24 transmits a signal TEMP to the controller 14 that is indicative of the temperature of the electrical component 18. The controller 14 determines whether the temperature of the electrical component 18 is greater than a temperature threshold. If the temperature of the electrical component 18 is greater than the temperature threshold, then the controller 14 determines that it may be necessary to energize an array of the various Peltier cells within the thermo-electric unit 22 to discharge heat away from the electrical component 18 and to the cooling unit 20. For example, the controller 14 energizes the thermo-electric unit 22 via a signal POWER_1 such that the thermo-electric unit 22 cools an upper portion thereof that is in contact with the electrical component 18, thus quickly cooling the same. In this case, the controller 14 may deliver at least a portion of the power as received from the battery 16 to the thermo-electric unit 22 on the signal POWER_1.

The controller 22 may also provide power to the cooling unit 20 via a signal POWER_2 to enable the cooling unit to circulate the liquid about the power module 12. The controller 14 may deliver at least a portion of the power as received from the battery 16 to the cooling unit 20 on the signal POWER_2.

In the event the controller 14 determines that the temperature of the electrical component 18 is less than the temperature threshold via the signal TEMP, then the controller 14 ceases to provide power to the thermo-electric unit 22, and there is no need to provide a fast cooling operation at the electrical component 18. In this case, a thermal difference may be present at the thermo-electric unit 22. For example, the top of thermo-electric unit 22 may be hot while the bottom portion thereof may be cool thus converting this temperature differential into electrical energy. The power module 12 may then transfer the generated electrical energy back to the controller 14 for delivery back to the battery 16 via the signal ENERGY. For example, the controller 14 may condition the recycled energy prior to the delivering it back to the battery 16. Alternatively, the power module 12 may simply provide the generated power directly to the battery 16 if no conditioning of the generated power is needed. Also, the power module 12 may transfer the generated electrical energy to the controller 14 to support energy requirements needed for various loads within a vehicle electrical network 19.

In general, the thermoelectric unit 22 as provided within the power module 12 may not only allow for an additional heat extraction mechanism, but may also provide for an accurate regulation of operating temperature of the electrical component 18 within the thermo-electric unit 22. Further, the positioning of the thermo-electric unit 22 proximate to the electrical component 18 may reduce the induced thermal stress by providing a more constant operating temperature (i.e., shorter thermal cycling). In addition, the characteristics and performance of the electrical component 18 may be more stable and predictable when working with lower and softer temperature changes.

The integration of the thermo-electrical unit 22 within the power module 12 may reduce the overall size of the power module 12 and increase overall power density. In addition, the implementation of the controller 14 controlling the thermo-electric unit 22 to enter into a cooling mode in a rapid manner may enable an increase in the switching frequency of the electrical component 18. With a higher frequency, an overall size of the defined magnetic passive components may also be reduced, which may also lead to a power density improvement. Power density is generally defined as a ratio between the volume of an electronic system that is required to manage a given amount of power (e.g., Watt/liter). Generally, a higher ratio is considered to be more ideal for the automotive market.

Figure 2:
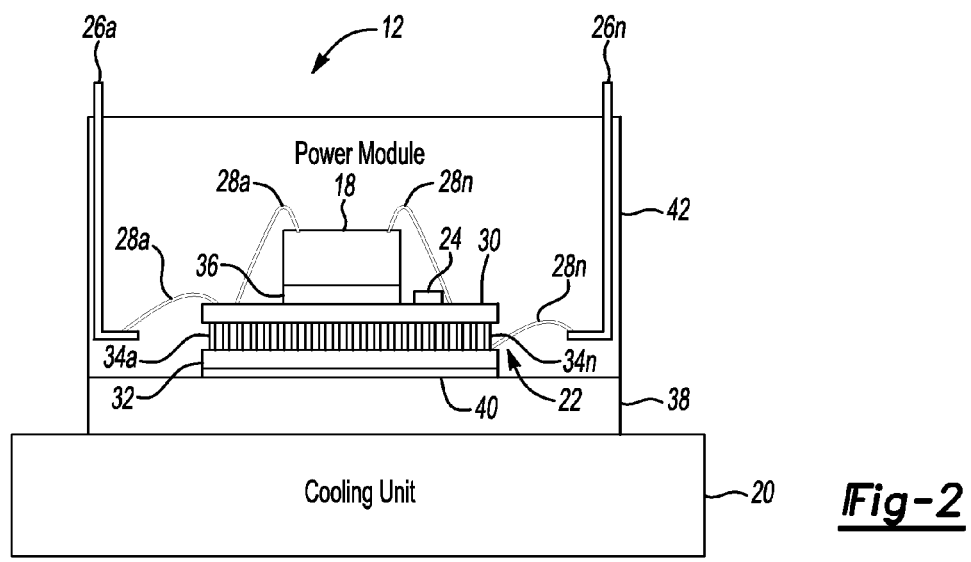
FIG. 2 depicts a detailed representation of the electrically cooled power module in accordance to one embodiment.

FIG. 2 depicts a detailed representation of the electrically cooled power module 12 in accordance to one embodiment. The power module 12 further includes a plurality of connection pins 26a-26n ("26") and a first plurality of wire bonds 28a-28n ("28"). Each pin 26 may be coupled to the controller 14 and/or other device for the purpose of converting energy. Each connection pin 28 is coupled to the controller 14 and/or other device via a respective wire bond 28.

The thermo-electric unit 22 includes a first printed circuit board (PCB) 30, a second PCB 32, and a plurality of thermoelectric cells 34a-34n ("34") positioned therebetween. The connector pin 26a is coupled to the first PCB 30 via the wire bond 28a. The connector pin 26n is coupled to the second PCB 32 via the wire bond 28n. The pins 26 are used for biasing the thermo-electric cells 34. For example, the controller 14 may apply power in one polarity via the pins 26a and 26n to control the thermo-electric cells 34 to cool the electrical component 18. It is recognized that while FIG. 2 illustrates a single connector pin 26a on a first side of the power module 12 and a single connector pin 26n located on a second side of the power module 12, there may be any number of connector pins positioned along with the connector pin 26a in a row like manner on the first side of the power module 12 and that there may be any number of connector pins positioned along with the connector pin 26n in a row like manner on the second side of the power module 12. The controller 14 may receive the energy generated by the thermoelectric cells 34 and may enable the energy received from the thermoelectric unit 22 to be provided to the battery 16 or to the vehicle electrical network 19.

The thermo-electric cells 34 may be Peltier cells that are formed of Bismuth Telluride (BiTe). Each of the first and the second PCB 30 and 32 are formed of a direct copper bonding (DCB) type. This generally means that a ceramic substrate is provided for each of the first PCB 30 and the second PCB 32. Also, a copper layer is attached or bonded at each side of the ceramic substrate. DCB boards may provide optimal properties (e.g., thermal conductance, mechanical support, and electrical isolation). A first die attach 36 is positioned between the electrical component 18 and the thermo-electric unit 22. The first die attach 36 is generally defined as an element which attaches the electrical component 18 to the first PCB 30. For example, the die attach 36 may be an alloy that is conductive and include adhesive properties. The die attach 36 generally enables adequate thermal transference for rapid heat flow.

A base plate 38 is positioned above the cooling unit 20. A fixation device 40 is positioned between the second PCB 32 and the cooling unit 20. A frame (or housing) 42 may surround at least a portion of the connection pins 26, the electrical component 18, the thermo-electric unit 22, and the base plate 38 and to form an enclosure over the same. In general, the electrical component 18, the first PCB 30, the thermoelectric cells 34, the second PCB 32, the first die attach 36, the base plate 38 (i.e., the power module 12), and the cooling unit 20 form a thermal path for discharging heat away from the electrical component 18 and to ambient.

The power module 12 is generally fixed to the cooling unit 20 via the base plate 38. The base plate 38 provides a contact interface between the thermo-electric unit 22 and the cooling unit 20 to minimize thermal resistance. In this way, heat generated by silicon (e.g., the electrical component 18) is dissipated through the thermal path.

Figure 3:
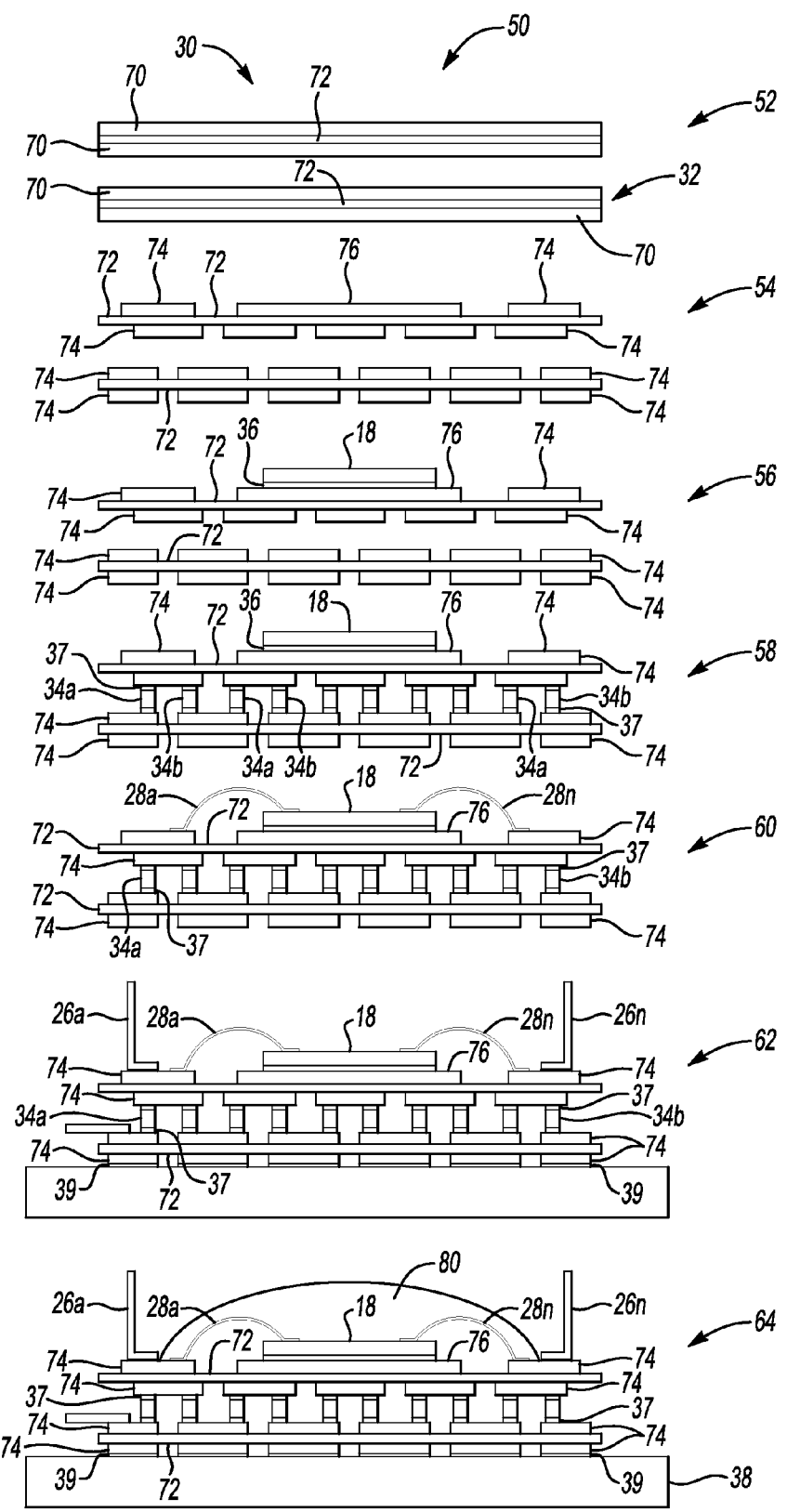
FIG. 3 depicts a method for forming at least a portion of the electrically cooled power module in accordance to one embodiment.

FIG. 3 depicts a method 50 for forming at least a portion of the electrically cooled power module 12 in accordance to one embodiment.

In operation 52, the first PCB 30 and the second PCB 32 are provided. Each of the first PCB 30 and the second PCB 32 are formed of DCB. The first PCB 30 includes first and second layers of copper (Cu) 70 and a ceramic substrate 72. The second PCB 32 also includes first and second layers of Cu 70 and a ceramic substrate 72. The ceramic substrate 72 may electrically isolate the first PCB 30 and the second PCB 32 and also provide increased levels of thermal conductance of the heat from the electrical component 18 through the thermoelectric cells 34a-34b when compared to FR4 or CEM 3 PCBs (or even pads or grease).

While the ceramic substrates 72 provide improved thermal conductance over FR4 and CEM3 based PCBs, the thermal conductance provide by metal may be better. However, the electrical isolation may be decreased with the use of metal. The use of the ceramic substrate 72 provides acceptable levels of thermal conduction while at the same time electrically isolates the first PCB 30 and the second PCB 32 from the electrical component 18.

In operation 54, the various layers of Cu 70 are etched for providing a plurality of copper portions 74 on each of the first PCB 30 and the second PCB 32. On the first PCB 30, a single copper region 76 is provided for receiving the electrical component 18. The overall size of the copper region 76 may be larger than that of each copper portion 74.

In operation 56, the electrical component 18 is attached to the copper region 76 with a high temperature alloy (e.g., PbSnAg) (or the first die attach 36) at a melting temperature of 300° C. The high temperature alloy may have a melting temperature of 300° C.

In operation 58, the thermo-electric cells 34 are attached to respective copper portions 74 positioned on an underside of the first PCB 30 and positioned on a top-side of the second PCB 32. The thermoelectric cells 34a may be p-type thermoelectric cells and the thermoelectric cells 34b may be n-type thermoelectric cells. The thermo-electric cells 34 are attached via second die attach 37 (e.g., solder or alloy such as SnAg) at an intermediate temperature of 221° C., etc. It is contemplated that the melting temperature of the alloy (e.g., the second die attach 37) used in operation 58 is less than the melting temperature of the PbSnAg based alloy (e.g., the first die attach 36) used in operation 56 to ensure that no additional melting of the first die attach 36 is achieved on the electrical component 18 which could lead to a defect.

In order to avoid excessive thermo-mechanical stress over the thermoelectric cells 34, a reflow temperature slope that is exhibited during the solder operation should be moderate and a layout of the copper portions 74 should be minimized to avoid dilation differences. For example, by utilizing the plurality of copper portions 74 such that gaps are formed between various copper portions 74, this condition may make dilation forces equal between the cooper portions 74 on the bottom side of the first PCB 30 and the plurality of cooper portions 74 on the top side of the second PCB 32. To this end, torsion forces that are applied during the soldering of the plurality of thermo-electric cells 34 (and after cooling) are minimized and the risk of breaking one or more of the thermoelectric cells 74 is minimized.

In operation 60, the wire bonds 28a and 28n are attached within the power module 12.

In operation 62, the copper portions 74 positioned on an underside of the second PCB 32 are attached to the base plate 38 via a third die attach 39 (e.g., solder or alloy). In this operation, the soldering temperature of the third die attach 39 is less than the soldering temperature of the second die attach 37 to ensure that the second die attach 37 applied in operation 58 is not affected by this operation (e.g., not melted). In one example, the third die attach 39 may be SnPb and may have a melting temperature of 180 C. The base plate 38 may include the frame 42 being attached thereto when the power module 12 is attached to the base plate 38. In addition, the connector pins 26 may be fixed to respective copper portions 74.

It is recognized that alternate soldering steps may be performed. For example, the thermoelectric cells 34 may be soldered first, provided the materials of the thermo-electric cells 74 can withstand the high temperature, after which, the electrical component 18 may be soldered thereafter at a temperature that is less than the temperature required to solder the thermoelectric cells 34.

In operation 64, a glob-top 80 is applied on top of the electrical component 18 and on the wire bonds 28a-28n.

Figure 4:
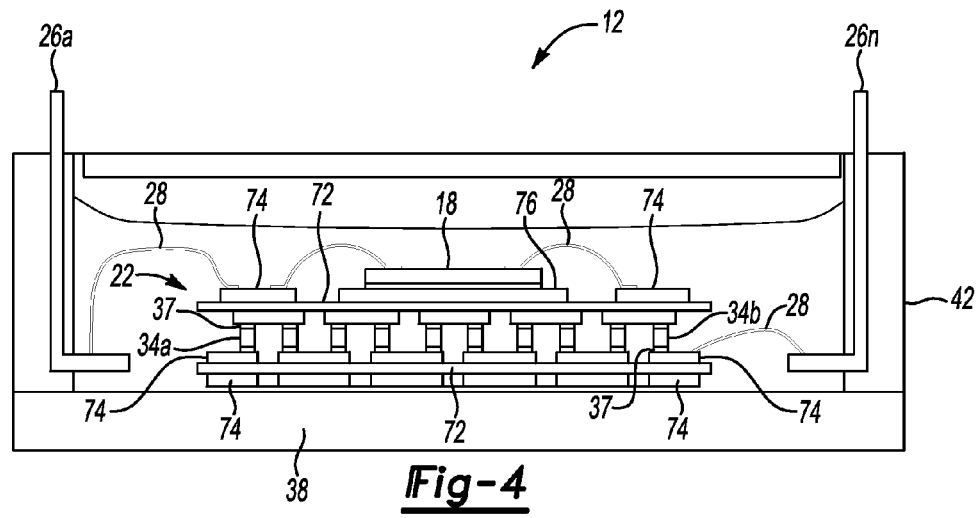
FIG. 4 depicts an enclosed power module in accordance to one embodiment.

FIG. 4 depicts an enclosed power module 12 in accordance to another embodiment. For example, the power module 12 as shown may include the connector pins 26 being over molded into the frame 42 as opposed to such pins 26 being soldered on respective copper portions 74 as shown in operation 62 and 64 as noted in connection with FIG. 3. Additional wire bonds 28 are provided to electrically connect the pins 26 to respective copper portions 74 of the first PCB 30 and to respective copper portions 74 of the second PCB 32. The interior volume of the power module 12 may include an encapsulant such as for example, a soft silicone. Once filled, a lid of the power module 12 is closed thereby enclosing the power module 12.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An apparatus for cooling an electrical component in a vehicle, the apparatus comprising:
   a power module including the electrical component for converting energy in the vehicle, the power module including:
      a first printed circuit board (PCB) including a first ceramic substrate for receiving the electrical component;
      a plurality of thermoelectric cells being positioned on an underside of the first PCB for discharging heat away from the electrical component; and
      a second PCB including a second ceramic substrate for receiving the plurality of thermoelectric cells on a top side thereof, the first ceramic substrate and the second ceramic substrate for electrically isolating the electrical component from the first PCB and the second PCB and for providing thermal conductance from the electrical component through the plurality of thermoelectric cells,
   wherein the plurality of thermoelectric cells are configured to generate electrical energy in the event a temperature differential is present between a top portion of the plurality of thermoelectric cells and a bottom portion of the plurality of thermoelectric cells, and
   wherein the power module is configured to provide the electrical energy to one of a vehicle battery and a vehicle electrical network.

2. The apparatus of claim 1 wherein the power module include a temperature sensor positioned about the electrical component for transmitting a temperature signal indicative of a temperature of the electrical component.

3. The apparatus of claim 2 further comprising a controller configured to receive the temperature signal and to power the plurality of thermoelectric cells in the event the temperature signal indicates that the temperature of the electrical component is above a temperature threshold.

4. The apparatus of claim 1 further comprising a cooling unit including a cooling loop for being in thermal communication with the electrical component and the plurality of thermoelectric cells for providing a thermal path to dissipate the heat from the electrical component to ambient.

5. The apparatus of claim 4 wherein the cooling unit is positioned below the electrical component and the plurality of thermoelectric cells.

6. The apparatus of claim 1 wherein the first PCB and the second PCB are formed of a direct copper bonding type.

7. The apparatus of claim 1 wherein each of the first PCB and the second PCB includes a plurality of copper portions for receiving a respective thermoelectric cell.

8. An apparatus for cooling an electrical component in a vehicle, the apparatus comprising:
   a power module including the electrical component for converting energy, the power module including:
      a first printed circuit board (PCB) including a first ceramic substrate for receiving the electrical component;
      a plurality of thermoelectric cells being coupled to the first PCB for discharging heat away from the electrical component; and
      a second PCB including a second ceramic substrate being coupled to the plurality of thermoelectric cells, the first ceramic substrate and the second ceramic substrate for electrically isolating the electrical component from the first PCB and the second PCB and for providing thermal conductance from the electrical component through the plurality of thermoelectric cells,
   wherein the plurality of thermoelectric cells are configured to generate electrical energy in the event a temperature differential is present between a top portion of the plurality of thermoelectric cells and a bottom portion of the plurality of thermoelectric cells, and
   wherein the power module is configured to provide the electrical energy to one of a vehicle battery and a vehicle electrical network.

9. The apparatus of claim 8 further comprising a cooling unit including a cooling loop for being in thermal communication with the electrical component and the plurality of thermoelectric cells for providing a thermal path to dissipate the heat from the electrical component to ambient.

10. The apparatus of claim 9 wherein the cooling unit is positioned below the electrical component and the plurality of thermoelectric cells.

11. The apparatus of claim 8 wherein the first PCB and the second PCB are formed of a direct copper bonding type.

12. The apparatus of claim 8 wherein each of the first PCB and the second PCB includes a plurality of copper portions for receiving a respective thermoelectric cell.

13. An apparatus for cooling an electrical component in a vehicle, the apparatus comprising:
   a power module including the electrical component for converting energy, the power module including:
      a first printed circuit board (PCB) including a first substrate for receiving the electrical component;
      a plurality of thermoelectric cells being coupled to the first substrate for discharging heat away from the electrical component;

a second PCB including a second substrate being coupled to the plurality of thermoelectric cells, and a cooling unit for receiving the heat from the electrical component from the second PCB, wherein the plurality of thermoelectric cells are configured to generate electrical energy in the event a temperature differential is present between a top portion of the plurality of thermoelectric cells and a bottom portion of the plurality of thermoelectric cells, and wherein the power module is configured to provide the electrical energy to one of a vehicle battery and a vehicle electrical network.

14. The apparatus of claim 13 wherein the cooling unit includes a cooling loop for discharging the heat from the electrical component.

15. The apparatus of claim 13 wherein the first PCB includes a first ceramic substrate for electrically isolating the first PCB from the electrical component.

16. The apparatus of claim 15 wherein the second PCB includes a second ceramic substrate for electrically isolating the second PCB from the electrical component and for providing thermal conductance through the plurality of thermoelectric cells.

\* \* \* \* \*